US010978502B2

United States Patent
de Haan et al.

(10) Patent No.: US 10,978,502 B2
(45) Date of Patent: Apr. 13, 2021

(54) IMAGE SENSOR (71) Applicant: Teledyne DALSA B.V., Thousand Oaks, CA (US)

(72) Inventors: W. J. de Haan, Eindhoven (NL); Daniel Verbugt, Helden (NL)

(73) Assignee: TELEDYNE DALSA B.V., Thousand Oaks, CA (US)

( * ) Notice: Subject to any disclaimer, the term of this patent is extended or adjusted under 35 U.S.C. 154(b) by 0 days.

(21) Appl. No.: 16/299,043

(22) Filed: Mar. 11, 2019

(65) Prior Publication Data
US 2019/0280028 A1 Sep. 12, 2019

(30) Foreign Application Priority Data
Mar. 12, 2018 (EP) .................. 18161290

(51) Int. Cl.
*G01T 1/02* (2006.01)
*H01L 27/146* (2006.01)
*H04N 5/3745* (2011.01)
*H04N 5/378* (2011.01)
*G01T 1/24* (2006.01)
*G01T 1/17* (2006.01)
*H04N 5/32* (2006.01)

(52) U.S. Cl.
CPC ......... *H01L 27/14605* (2013.01); *G01T 1/17* (2013.01); *G01T 1/243* (2013.01); *H01L 27/14609* (2013.01); *H04N 5/32* (2013.01); *H04N 5/378* (2013.01); *H04N 5/37452* (2013.01)

(58) Field of Classification Search
CPC ......... H01L 27/14605; H01L 27/14609; G01T 1/243; G01T 1/17; H04N 5/32; H04N 5/37452; H04N 5/378
See application file for complete search history.

(56) References Cited

U.S. PATENT DOCUMENTS

| 6,022,649 | A  | * | 2/2000  | Neoh et al. ....... H01L 27/14603 |
| 7,659,516 | B2 |   | 2/2010  | Korthout et al. |
| 9,247,169 | B2 | * | 1/2016  | Guerrini ........... H01L 27/14603 |
| 2002/0181648 | A1 | * | 12/2002 | Ruetten .................. G01T 1/026 378/19 |

(Continued)

FOREIGN PATENT DOCUMENTS

EP 2623032 8/2013

OTHER PUBLICATIONS

European Search Report for EP18161290.4, dated Oct. 18, 2018.

*Primary Examiner* — Kiho Kim
(74) *Attorney, Agent, or Firm* — Snell & Wilmer LLP (57) ABSTRACT

The present invention relates to an image sensor. More in particular, the present invention relates to an image sensor that comprises dose sensing pixels to sense an incident dose of photons. Such dose sensing can be used to trigger an image capturing process. A dose sensing pixel will act as a dose sensing pixel in a dose sensing mode of the sensor in dependence of a signal on a dose select line. The invention proposes a dose select line connecting unit for connecting dose select lines of a first stitching block among adjacent stitching blocks to a respective dose select line of a second stitching block among adjacent stitching blocks to prevent multiple dose sensing pixels in the same column of the matrix of pixels from being selected in the dose sensing mode.

15 Claims, 5 Drawing Sheets

(56) References Cited

U.S. PATENT DOCUMENTS

| | | | |
|---|---|---|---|
| 2005/0285043 A1* | 12/2005 | Nascetti | G01T 1/026 |
| | | | 250/370.09 |
| 2008/0001094 A1 | 1/2008 | Korthout et al. | |
| 2014/0061496 A1 | 3/2014 | Nakatsugawa et al. | |
| 2015/0078528 A1* | 3/2015 | Okada | G01T 1/026 |
| | | | 378/97 |
| 2015/0164459 A1* | 6/2015 | Ito | A61B 6/4233 |
| | | | 378/97 |
| 2015/0164461 A1* | 6/2015 | Imamura | H05G 1/42 |
| | | | 378/97 |
| 2016/0021290 A1* | 1/2016 | Yagi | H04N 5/378 |
| | | | 250/394 |
| 2016/0294392 A1* | 10/2016 | Charrier | H04N 5/378 |
| 2016/0301888 A1* | 10/2016 | Ahn | H04N 5/378 |
| 2017/0117317 A1* | 4/2017 | Sun | H01L 27/14607 |

\* cited by examiner

IMAGE SENSOR

CROSS-REFERENCE TO RELATED APPLICATIONS

The present application is a U.S. national phase entry of and claims priority from European Application No. EP 18161290.4, filed on Mar. 12, 2018, which is hereby fully incorporated herein by reference in its entirety.

The present invention relates to an image sensor. More in particular, the present invention relates to an image sensor that comprises dose sensing pixels to sense an incident dose of photons. Such dose sensing can be used to trigger an image capturing process. Such dose sensing is important in the field of X-ray imaging, where these image sensors can be used.

A typical X-ray sensor configured for detecting X-rays comprises a matrix of rows and columns of photosensitive pixels. The matrix is covered with a scintillator layer that converts incoming X-ray photons into visible light photons that can be detected by the matrix of photosensitive pixels. To address each pixel for subsequent read-out, an active matrix is used wherein pixels in a given row can be selected at the same time, and wherein the selected pixels can be read out at the same time using column-specific read-out circuitry. This read-out circuitry is configured for receiving a signal on a column line to which all pixels in the same column are connected. Accordingly, it is impossible to read out multiple selected pixels in the same column.

When X-ray sensors are used for medical imaging it is important to avoid excess exposure of the patient to X-ray radiation. Consequently, the dose settings for the X-ray source need to be adjusted to the particular type of diagnosis, tissue type, etc. On the other hand, the emitted X-ray radiation needs to be utilized as efficiently as possible. In other words, the patient should not be exposed to X-ray radiation when this radiation is not used for imaging purposes.

In some X-ray system setups, there is no synchronization between the X-ray source and the X-ray sensor. This introduces the problem that the X-ray sensor is unaware of when the X-ray source will emit X-ray radiation. This makes it difficult for the X-ray sensor to determine a suitable starting point for starting the image capturing process. One possible option would be to repeatedly start an image capturing process. However, to read out the pixel matrix, each row of pixels needs to be individually selected and read out. Consequently, the time required to read out the entire matrix may be too large when compared to the period in which the X-ray radiation is emitted. In some cases, the time required for reading out the matrix far exceeds the period in which the X-ray radiation is emitted.

U.S. Pat. No. 7,659,516B2 presents a solution to address this problem. This document discloses an image sensor in which some of the photosensitive pixels are designated as dose sensing pixels, hereinafter referred to as second pixels. In an embodiment, these pixels are distributed over the entire matrix such that each column of the matrix comprises at most one second pixel. This makes it possible to read out every second pixel at the same time as the distribution of the second pixels prevents the situation that second pixels in different rows but in the same column are simultaneously selected and read out.

Figure 1:
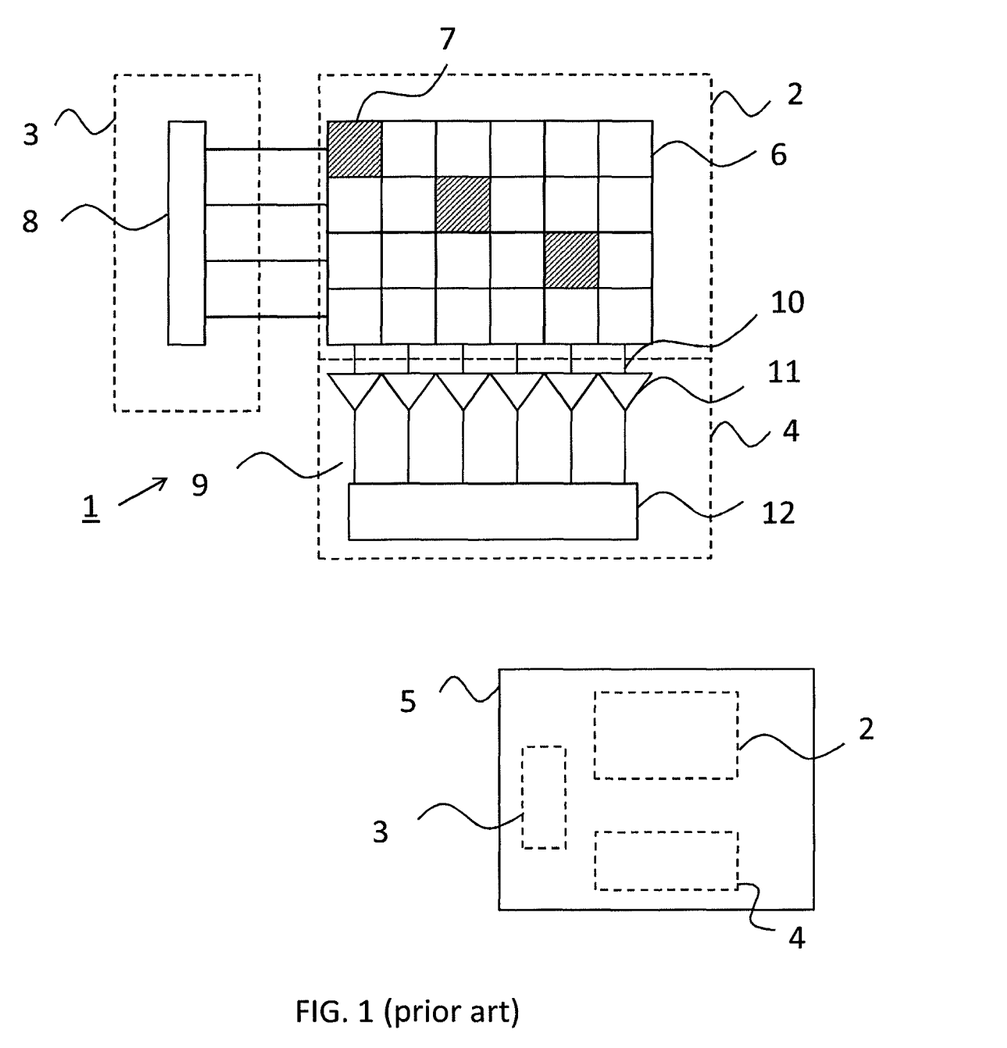
FIG. 1 illustrates a known image sensor comprising dose sensing pixels and a reticle layout used for the fabrication of this image sensor.

The abovementioned known solution is schematically illustrated in FIG. 1. Here, an image sensor 1 is shown that is manufactured using three reticle blocks 2, 3, 4 that are comprised in a reticle 5. As shown in FIG. 1, the arrangement of reticle blocks 2, 3, 4 in reticle 5 may be different than in image sensor 1 itself. In such cases, image sensor 1 is formed by selectively using one of the reticle blocks 2, 3, 4 in a photolithography process while blocking the others. After each step, reticle 5 is re-aligned with the semiconductor substrate of image sensor 1 for a next lithography step using a different reticle block 2, 3, 4. It should be noted that the present invention does not exclude other arrangements of reticle blocks 2, 3, 4, for example wherein the reticle blocks 2, 3, 4 have an arrangement on reticle 5 that is similar or identical to the arrangement in image sensor 1. In such embodiment, a single lithography step may be used per layer of image sensor 1. The skilled person is aware that image sensor 1 is built up out of several layers, each layer being formed using a respective reticle 5. However, for sake of simplicity, reference will be made to a single reticle 5 as opposed to a reticle set.

In the known image sensor, reticle block 2 is used to define a matrix of pixels comprising a plurality of first pixels 6 and a plurality of second pixels 7. Reticle block 3 is used for defining a pixel select controller 8 that is configured for, in an image read-out mode of the image sensor, simultaneously selecting first pixels and second pixels in a given row, one row at a time. Pixel controller 8 is further configured for, in a dose sensing mode of the image sensor, simultaneously selecting second pixels in different rows.

Image sensor 1 further comprises read-out circuitry 9 for reading out the photosensitive pixels. Read-out circuitry 9 comprises a plurality of column lines 10 that are each connected to a plurality of pixels 6, 7 that are arranged in the same column but in different rows. Furthermore, read-out circuitry 9 comprises a plurality of analog-to-digital converters (ADCs) 11 for converting the analog voltages into digital values and a collecting unit 12 for collecting and outputting the digital values. As shown in FIG. 1, read-out circuitry 9 is formed using reticle block 4.

Figure 2:
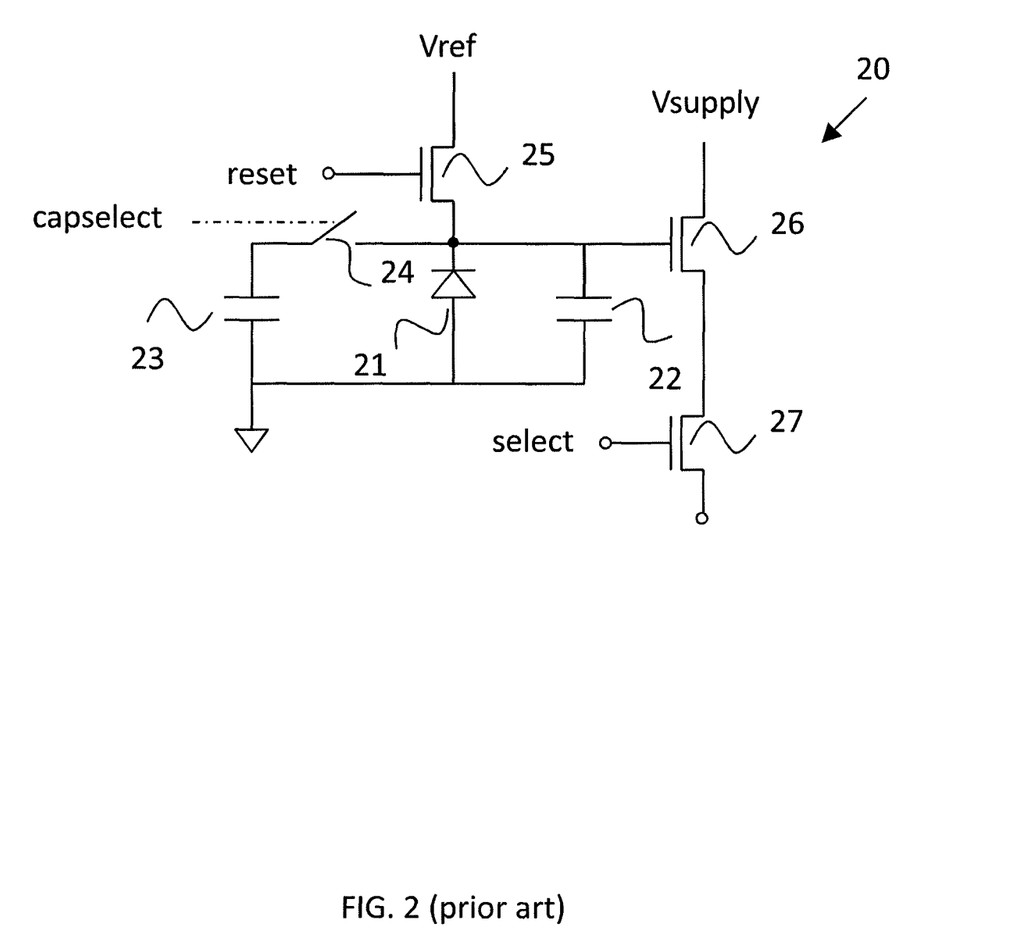
FIG. 2 illustrates a known 3T pixel layout.

FIG. 2 presents an example of a known schematic for a pixel 20, referred to as a 3T layout, which can be used in the image sensor in FIG. 1. Here, pixel 20 may correspond to a first pixel 6 or a second pixel 7. Pixel 20 comprises a (pinned) photodiode 21, a primary storage capacitor 22, and a secondary storage capacitor 23 which can be switched using a switch 24. Typically, a scintillator layer (not illustrated) is applied over the pixel or is integrated therewith. This layer converts incoming X-rays into visible light which can be detected by photodiode 21.

The operation of the pixel can be explained as follows. As a first step, the voltage at the terminal between capacitor 22 and photodiode 21 is charged/reset to a predefined reference voltage Vref using a NMOST 25 in response to a reset signal received from pixel select controller 8. Next, NMOST 25 is brought into in a non-conducting state. When light falls onto photodiode 21, it generates charges which are transferred to capacitor 22. Consequently, the voltage at the terminal of capacitor 22 will decrease depending on the incident light. After a predetermined time, e.g. the integration time, the voltage at this terminal is sensed using a source follower NMOST 26 that is connected to an NMOST 27 that acts as a selection FET. More in particular, in response to a select signal from pixel select controller 8, the voltage at the terminal of capacitor 22, referred to as the photo-voltage, is fed through source follower 26 and selection FET 27 to read-out circuitry 9 via a pixel column line 10. There, the analog signal is converted into a digital value using ADC 11. As a final step, selection FET 27 is brought into a non-conductive state and the process is repeated.

By closing switch 24, in response to receiving a capacitance select signal from pixel select controller 8, secondary storage capacitor 23 can be put parallel to primary storage capacitor 22. This allows the pixel to process a higher dose of X-rays as the effective storage capacitance has increased, and to thereby offer a different sensitivity. The skilled person will understand that having a secondary storage capacitor is optional. In addition, the invention equally relates to embodiments wherein storage capacitor 22 is intrinsically present in photodiode 21.

Prior to the actual image capturing process, first and second pixels 6, 7 are reset such that the photo-voltage is set to the predefined voltage Vref. Due to the generated photo-current, the photo-voltage will decrease in dependence of the incoming X-ray dose. This photo-voltage cannot decrease indefinitely. A lower limit exists at which the photo-voltage is still a reliable measure for the incoming X-ray dose. If a higher dose has been used, the pixel will saturate and no information other than that the dose has exceeded a certain threshold can be derived from the reading.

Even if no X-ray radiation is emitted towards the X-ray sensor, the photo-voltage will change. This phenomenon is known as dark current. Therefore, a pixel needs to be reset directly before image capture. Secondly, the period during which the X-ray radiation is captured by the image sensor, referred to as the integration time, should be matched to the period during which the X-ray source emits X-ray radiation as closely as possible.

As stated above, U.S. Pat. No. 7,659,516B2 proposes to use the information from second pixels 7 to set a starting point for the actual image capturing process. For example, if a dose is detected by second pixels 7 that exceeds a predefined threshold, the entire matrix is reset and the image capturing process starts. In this manner, only a limited amount of the X-ray dose is lost. More in particular, in the dose sensing mode, second pixels 7 are first reset to the predefined voltage. Thereafter, the photo-voltage of these pixels is monitored without resetting the photo-voltage, known as non-destructive read-out. When the measured dose, determined using the photo-voltage, exceeds a threshold, the operational mode of the image sensor is switched to the image read-out mode. Because the photo-voltage will gradually decrease due to dark currents, a false triggering may be generated. Therefore, the photo-voltage of second pixels 7 has to be reset regularly.

The abovementioned solution can even be applied in cases wherein two or more second pixels 7 are provided for each column. However, in these cases, second pixels 7 cannot be selected at the same time but need to be selected on a row basis. This will increase the time required for determining the incoming dose, resulting in a larger loss of X-ray dose that is not used for the actual image capturing.

The abovementioned solution is particularly applicable to relatively small sensors. For larger X-ray sensors, it can no longer be guaranteed that only a single second pixel is arranged for each column. This is related to the manner in which these sensors are constructed. More in particular, a wafer stepping technique is used in which the image sensor comprises a plurality of adjacently arranged identical stitching blocks. Each stitching block has been formed using wafer stepper lithography on the basis of the same reticle block(s). Therefore, if a second pixel is arranged for a given column in a given stitching block, and a further stitching block is adjacently arranged in the column direction, a total of two second pixels will be arranged for the same column. Therefore, the second pixels need to be addressed in a row specific manner during the dose sensing process, thereby resulting in a larger loss of X-ray dose that is not used for the actual image capturing.

An object of the present invention is to provide a solution to this problem, allowing an efficient and fast dose sensing process in larger sensors that comprise a plurality of stitching blocks.

This object has been achieved with the image sensor as defined in claim 1, which comprises a matrix of rows and columns of photosensitive pixels, wherein the matrix comprises stitching blocks that are adjacently arranged in the column direction of the matrix. Each stitching block comprises a plurality of first pixels and a plurality of second pixels, a plurality of dose select lines configured for carrying respective dose select signals. Each stitching block further comprises a pixel select controller configured for, in an image read-out mode of the image sensor, simultaneously selecting first pixels and second pixels, in a given row and given stitching block, one row at a time. The pixel select controller is further configured for, in a dose sensing mode of the image sensor, simultaneously selecting second pixels in different rows and different stitching blocks in dependence of the dose select signals.

The image sensor according to the invention further comprises, at each connecting interface between stitching blocks that are adjacently arranged in the column direction, a dose select line connecting unit for connecting each dose select line of a first stitching block among the adjacent stitching blocks to a respective dose select line of a second stitching block among the adjacent stitching blocks to prevent multiple second pixels in the same column of the matrix from being selected.

According to the invention, second pixels in a stitching block are selected based on signal levels on the dose select lines. The dose select line connecting unit switches these signals at the interface between adjacent stitching blocks so that each stitching block displays a different distribution of the signals over the dose select lines.

Each stitching block may comprise a first part arranged on a first side of the stitching block, and a second part arranged on a second side of the stitching block opposite to the first side, wherein the dose select line connecting unit at an interface between a pair of adjacently arranged stitching blocks comprises the first part of one stitching block among the adjacently arranged stitching blocks and the second part of the other stitching block among the adjacently arranged stitching blocks. Alternatively, each stitching block may comprise a respective dose select line connecting unit arranged on a first side of the stitching block.

The dose select lines may be adjacently arranged in the row direction of the matrix in a given order, each dose select line having a given position within said order, wherein the position of a dose select line in a given stitching block is different from the position of the dose select line in the adjacently arranged stitching block to which it is connected. For example, each stitching block among three stitching blocks that are adjacently arranged in the column direction may comprise 3 dose select lines extending in parallel to the column direction. The line arranged on the left is referred to as the first line (L1), the line in the middle as the second line (L2), and the line on the right as the third line (L3). The first line of the $n^{th}$ stitching block in the column direction, with n ranging from 1, corresponding to the stitching block on the top, to 3, corresponding to the stitching block on the bottom, is referred to as L1_$n$. For example, L2_3 corresponds to the second line of the third stitching block. Using this notation, a possible embodiment of the invention is indicated in the table below:

| Dose select signal 1 | Dose select signal 2 | Dose select signal 3 |
|---|---|---|
| L1_1 | L2_1 | L3_1 |
| L2_2 | L3_2 | L1_2 |
| L3_3 | L1_3 | L2_3 |

Here, a dose select signal 1 is put on L1_1. This line is electrically connected to L2_2 and L3_3 of the other stitching blocks. It can be verified that a given dose select signal is present on different lines in different stitching blocks.

The pixel select controller may be configured for selecting the first pixels and the second pixels in the image read-out mode in dependence of a global select signal and a row-specific row select signal, and wherein the pixel select controller is configured for selecting the second pixels in the dose sensing mode in dependence of the global select signal and the dose select signals. If the image sensor were to have a single stitching block, the global select signal could be used to select every second pixel in the dose sensing mode. According to the invention, multiple stitching blocks are used. Using the dose select signals, the situation can be avoided wherein multiple second pixels are selected in the same column. In the image read-out mode, only a single row of pixels, including the first and second pixels, is selected at the same time. To that end, the selection of the first and second pixels can be made dependent on a row-specific row select signal.

The image sensor may further comprise a row driver, preferably comprised in the pixel select controller, and configured for generating the row-specific row select signal for selecting pixels that are in the same row, and a timing generator for generating the global select signal, and at least one of the dose select signals. The row-specific row select signal may be generated by a shift register comprised in the pixel select controller. Here, it is noted that shift registers of stitching blocks that are adjacently arranged in the column direction are electrically coupled to each other to form one large shift register.

A level of one or more of the dose select signals may be controllable between a low and a high level, and wherein the other dose select signals have a fixed level. The fixed level may correspond to a ground level, e.g. 0V.

The dose select line(s) in each stitching block, of which dose select lines the level can be controlled, may be configured to provide a dose select signal for selecting a pattern of second pixels in that stitching block during the dose sensing mode, wherein the patterns of second pixels for different stitching blocks are different. For example, the patterns of second pixels of different stitching blocks may be shifted in the row direction with respect to each other.

It should be noted that each stitching block generally comprises the same connections required for the first and second pixels. A first pixel in a stitching block will generally only be used in the image read-out mode. However, a second pixel at a given position in a stitching block may, depending on the dose select signals during operation, only be used in the image read-out mode, whereas this same pixel but in a different stitching block may be used in the image read-out mode and in the dose sensing mode.

The pixel select controller may comprise a plurality of identical pixel select sub-controller blocks that are adjacently arranged in the column direction and wherein each pixel select sub-controller block is configured, in the dose sensing mode, to select one among n second pixels that are arranged on respective and preferably adjacent rows, wherein n corresponds to the number of stitching blocks that are adjacently arranged in the column direction. Again, which second pixel is selected by a pixel select sub-controller block depends on the dose select signals.

As an example, in a three stitching block sensor, a pixel select sub-controller may be configured such that it is able to select one among three second pixels that are arranged in three adjacent rows. Moreover, these pixels are offset by one pixel in the row direction. The position of these pixels could for example be denoted as p, p+1, and p+2. During operation, this sub-controller, arranged in the first stitching block, may select the second pixel at position p to be used in the dose sensing mode. This same sub-controller, albeit arranged in the second stitching block, may select the second pixel at position p+1 to be used in the dose sensing mode. Selecting second pixels at different positions in different stitching blocks is made possible using the dose select line connecting unit.

Preferably, the number of stitching blocks adjacently arranged in the column direction is equal to the number of dose select lines.

The image sensor may further comprise read-out circuitry for reading out photo-voltages of the photosensitive pixels. The read-out circuitry is connected to a plurality of column lines that each are arranged over each stitching block, each column line being connected to a plurality of pixels that are arranged in the same column but in different rows. The column lines are typically formed using line segments in the various stitching blocks that are mutually connected at the interfaces between the stitching blocks. The circuitry for reading the voltage on the column lines can be arranged on one end of image sensor and is typically formed using a different reticle block.

Each of the first and second pixels may comprise a photodiode for generating a photocurrent, and a storage capacitor of which a terminal is connected to the photodiode, the voltage at the terminal being referred to as the photo-voltage. The pixel may further comprise a reset transistor for resetting the voltage at the terminal to a predefined voltage, a select transistor for selecting the pixel in dependence of a pixel select signal, and a source follower for feeding the photo-voltage to the column line to which the pixel is connected when the pixel is selected. This configuration is known as a 3T pixel.

The image sensor may be configured to perform a correlated sampling scheme, wherein reading out a photo-voltage of a pixel in the image read-out mode may comprise a first read-out step in which the photo-voltage of the pixel is reset to a predefined value and is thereafter being allowed, during an integration time, to change in response to a dose of incident photons, the photo voltage being read as a first voltage after expiry of the integration time. The scheme may further comprise a second read-out step in which the photo-voltage of the pixel is reset to the predefined value and is directly subsequently read as a second voltage. The read-out circuitry may be configured to compute a pixel voltage by subtracting the first voltage from the second voltage.

Additionally or alternatively, the image sensor may be configured to perform a correlated sampling scheme, wherein reading out a photo-voltage of a second pixel in the dose sensing mode comprises a step of re-setting the photo-voltage of the pixel to a predefined value, and a read-out step of reading the photo-voltage as a third voltage. The read-out circuitry may be configured to compute a pixel voltage by subtracting the third voltage from the predefined voltage. Whereas in the image read-out mode, the pixels are reset to a predefined voltage prior to each read-out, this does not apply for the second pixels in the dose sensing mode. Here, the second pixels are read out in dependence of the dose select signals a multiple times before a next reset is performed. A reset may for instance be required if the photovoltage has changed too much due to dark currents.

The image sensor may be configured to switch or to be switched from the dose sensing mode to the image read-out mode when the dose determined in the dose sensing mode exceeds a predefined threshold. Such dose is generally determined by examining the pixel voltages of the dose sensing pixels. Here, an average pixel voltage or dose may be determined for the entire collection of second pixels involved in the dose sensing mode. The invention does not exclude other thresholds to be used.

The image sensor may be an X-ray sensor in which the matrix of pixels comprises a scintillator layer for converting an incoming X-ray photon into a visible light photon. However, the invention equally relates to optical sensors used in photography, etc.

According to a further aspect, the invention provides an X-ray imaging system, comprising an X-ray source, an X-ray detector comprising the image sensor as defined above, and an image processing unit for constructing an X-ray image based on read-outs of the X-ray detector.

Next, the invention will be described in more detail by referring to the appended drawings, wherein.

Figure 3:
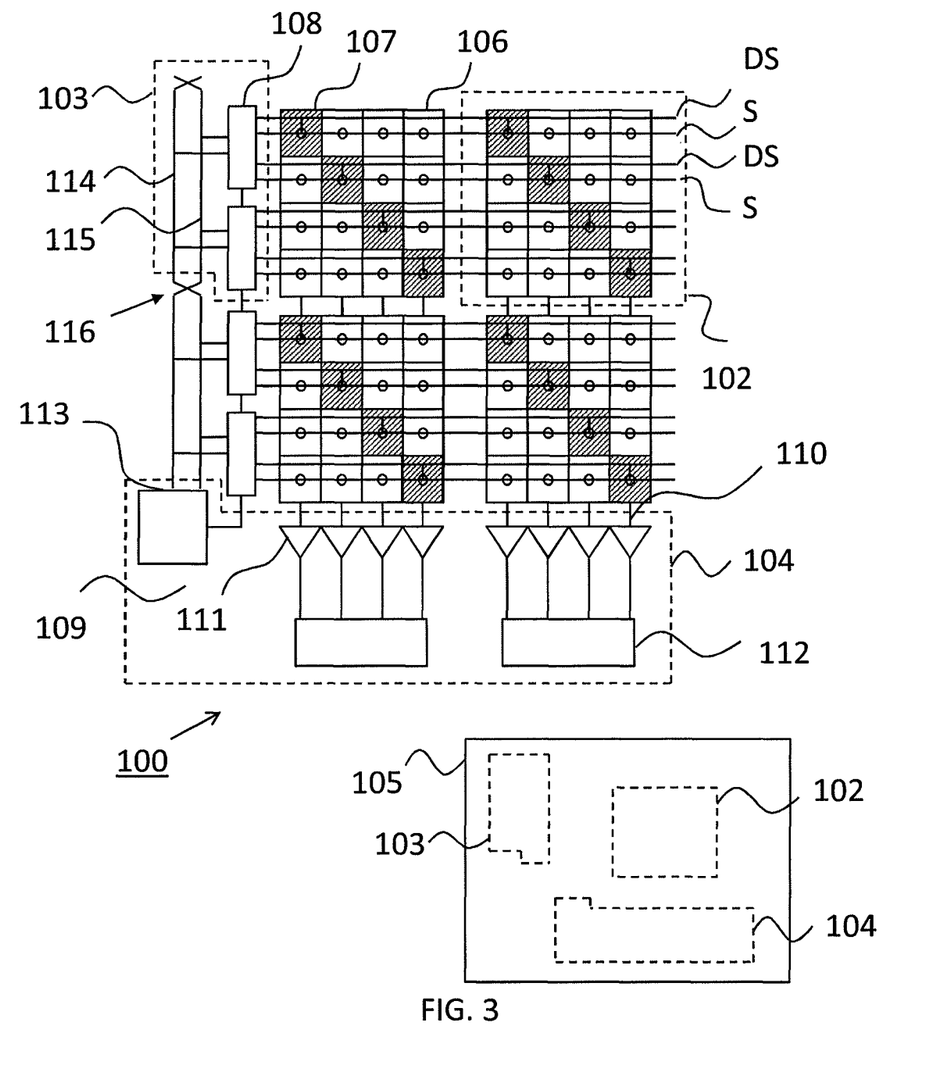
FIG. 3 illustrates an embodiment of an image sensor in accordance with the present invention comprising multiple stitching blocks, and a reticle layout used for the fabrication of this image sensor.

FIG. 3 illustrates an image sensor 100 in accordance with the present invention. Furthermore, FIG. 3 illustrates a reticle 105 that was used for the fabrication of image sensor 100. As shown, reticle 105 comprises reticle blocks 102, 103, and 104 used for the realization of the matrix of first pixels 106 and second pixels 107, the pixel controllers, and read-out circuitry 109. First pixels 106 and second pixels 107 may be configured as pixel 20 shown in FIG. 2.

When compared with the known sensor of FIG. 1, it can be observed that image sensor 100 comprises a repetition or stitching of the various reticle blocks. For example, the matrix of pixels comprises four identical stitching blocks, each corresponding to reticle block 102, and the pixel controller comprises two identical stitching blocks, each corresponding to reticle block 103. Furthermore, the pixel controller comprises a plurality of identical pixel select sub-controller blocks 108.

Read-out circuitry 109 is formed using reticle block 104 and comprises the circuitry required for reading out each column of the matrix of pixels. In addition, a timing generator 113 may be formed using reticle block 104. It is noted that read-out circuitry 109 could also be formed using two stitching blocks that are stitched in the row direction. In such embodiment, reticle block 104 would be reduced in size and the structures used for forming timing generator 113 would be located in a dedicated reticle block. The skilled person readily understands that much larger image sensors may be formed using reticle 105.

Reticle block 103 used for the fabrication of pixel select sub-controller blocks 108 also comprises structures for the formation of dose select lines 114, 115 and structures for the formation of a dose select line connecting unit 116. Using this latter unit, the dose select lines of adjacently arranged stitching blocks are connected. Furthermore, at the bottom of sensor 100, dose select lines 114, 115 are connected to timing generator 113.

As shown in FIG. 3, several control lines extend from pixel select sub-controller blocks 108 to first and second pixels 106, 107. Firstly, select lines S extend from blocks 108 to first pixels 106 and are connected thereto. Secondly, select lines DS extend from blocks 108 to second pixels 107 and are connected thereto.

Figure 4:
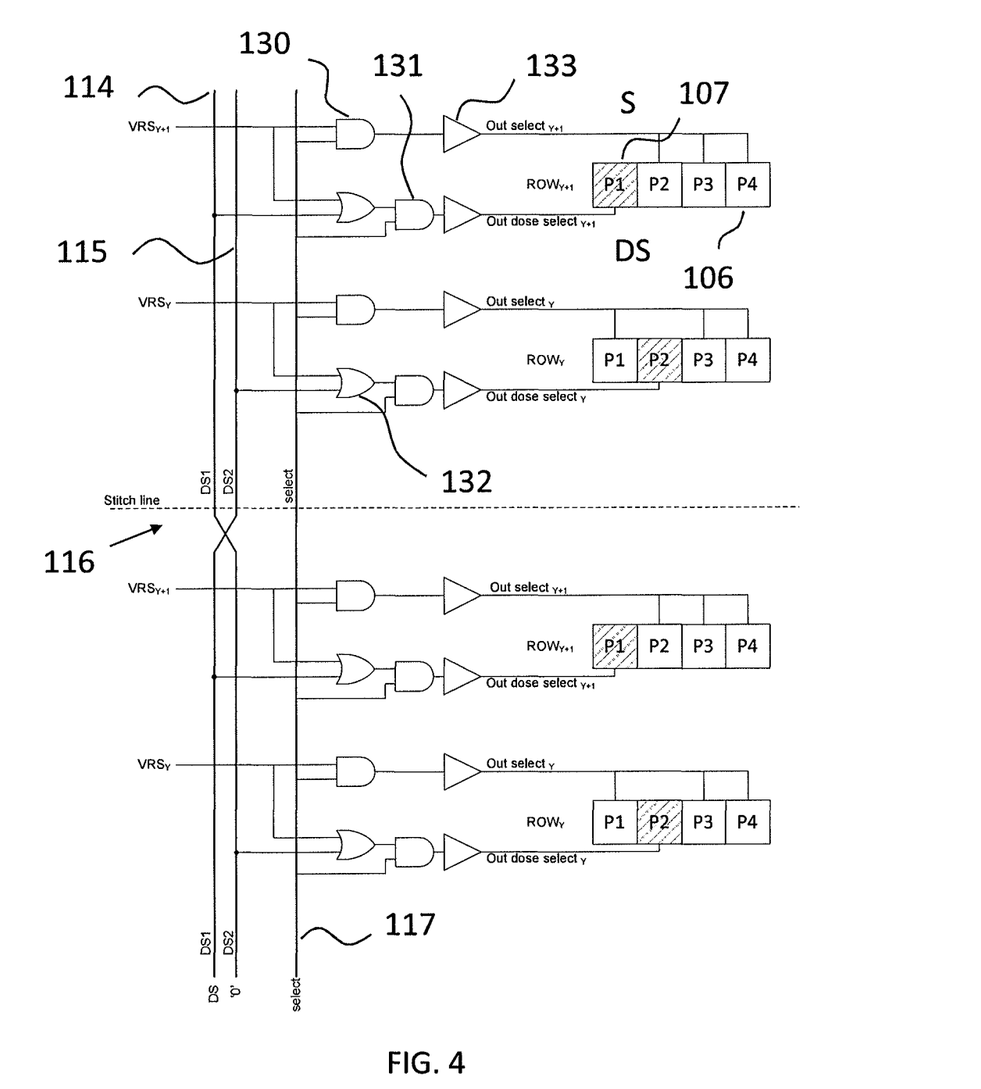
FIG. 4 illustrates a pixel controller used in the embodiment of FIG. 3.

Next, the operation of image sensor 100 will be explained by referring to FIGS. 3 and 4, wherein FIG. 4 illustrates the pixel controller of FIG. 3 in more detail. In FIG. 4, first pixels 106 are represented by blocks P1-P4 without pattern, whereas second pixels 107 are represented by blocks P1-P4 with a pattern. For example, FIG. 4 illustrates a total of four second pixels 107.

As can be seen in FIG. 3, each stitching block of pixels is associated with two pixel select sub-controller blocks 108. For reasons of clarity, FIG. 4 only illustrates a single pixel select sub-controller block for each stitching block.

Each pixel select sub-controller block has an identical structure. Each blocks comprises two AND gates 130 that are fed with a row select signal $VRS_{Y+1}$, $VRS_Y$, which is generated in a shift register located inside pixel select sub-controller block 108 itself, and a global select signal that is fed using a line 117 that is connected to timing generator 113. Here, it is noted that line 117 is formed using line segments that are formed using reticle block 103 and that are stitched together to form a single line. The same holds for dose select lines 114, 115.

Each pixel select sub-controller block 108 further comprises two OR gates 132 and two AND gates 131. The output of these logic gates is fed to a buffer 133 to provide sufficient signal strength for controlling the connected pixels.

The dashed line corresponds to the stitching line. Consequently, the layout above and below the stitching line is identical as both parts are formed using the same reticle block(s). Consequently, in each column of pixels, two second pixels 107 may be identified, which normally would require two separate addressing steps to read out. Despite the fact that the layout above and below the stitching line is identical, the present invention allows the use of only a single second pixel 107 for each column for dose sensing purposes. This will be explained next.

At the interface of the stitching blocks, a dose select line connecting unit 116 is arranged to facilitate the coupling between dose select lines 114, 115 in the stitching blocks. However, instead of connecting the dose select lines in a regular manner, wherein each dose line is connected to a correspondingly arranged dose in another stitching block, the invention proposes to switch these signals. More in particular, dose select lines 114, 115 may be arranged in a given order that is identical for each stitching block. Each dose select line 114, 115 may then be associated with a given position in that order. For example, dose select line 114 is arranged to the left and dose select line 115 to the right. The purpose of dose select line connecting unit 116 is to connect lines from different stitching blocks having a different position in those blocks. For example, in FIG. 4, the dose select line on the left, i.e. line 114, in the top block is connected to the dose select line on the right in the bottom block, i.e. line 115. Similarly, the dose select line on the right in the top block, i.e. line 115, is connected to the dose select line on the left, i.e. line 114 in the bottom block.

Now returning to the pixel controller, one OR gate 132 of pixel select sub-controller block 108 is connected to dose select line 114, whereas the other OR gate 132 of the same other pixel select sub-controller block 108 is connected to dose select line 115. The output of OR gate 132 is fed to an AND gate 131 which also receives the global select signal on line 117. The output of AND gate 131 is fed to a buffer 133, which feeds the outputted signal to the second pixels 107 that are arranged in that row. In FIGS. 3 and 4, each pixel select sub-controller block 108 is connected to two second pixels 107. On the other hand, the output of each AND gate 130 is fed to the first pixels 106 that are arranged in that row.

A similar pixel select sub-controller block 108 may be arranged in each stitching block for selecting pixels P3 and P4. The difference between such block and the block shown in FIG. 4 would be that the output of AND gates 131 is not connected to P1 and P2 but to P3 and P4.

In FIG. 4, the signal level on dose select line 115 is kept at ground potential, whereas the signals on lines 114 and 117 are controlled by timing generator 113.

Next, the dose sensing mode will be explained. In this mode, the shift registers of pixel select sub-controller blocks 108 output a low logical signal. To start, a global reset is performed setting the photo-voltages in each pixel 106, 107 to a predefined voltage. Then, a high logical signal may be put onto dose select line 114 of the bottom stitching block. Consequently, the first pixel P1 in the top row (first row) and the third pixel P3 of the third row of the bottom stitching block will be selected when the global select signal on line 117 is high. In the second and fourth rows of the bottom stitching block, no second pixel will be selected. Due to the dose select connection unit 116, the signals in the top stitching block will be reversed. In other words, the signal on line 115 will be at the high logical level. Hence, in the top stitching block, the second pixel P2 in the second row and the fourth pixel P4 in the bottom row of that block will be selected. As these pixels are situated in different columns than the pixels P1 and P3 selected in the bottom stitching block, a situation is prevented in which two or more second pixels can be selected in the same column.

Once selected, second pixels P1-P4 can be simultaneously read out. To this end, an artificial pixel may be used similar to the pixel shown in FIG. 2 albeit without a photodiode. In this pixel, which is typically arranged only in the bottom stitching block, the reference voltage is fed via the source follower onto the column line. In read-out circuitry 106, the read-out from a second pixel in a given column is subtracted from the output of the artificial pixel to form a pixel voltage. The use of an artificial pixel allows some offset errors, such as those associated with the source follower, to be eliminated.

If the pixel voltages associated with P1-P4 are above a given threshold, it may be determined that the X-ray source or other light source has started to emit radiation or light onto the image sensor and that the image sensor should switch to the image read-out mode.

If the photo-voltage in second pixels 107 drops below a given value due to dark currents, a global reset may again be applied.

In the image read-out mode, the shift registers of pixel select sub-controller blocks 108 sequentially output a high logical signal. In FIG. 4, first $VRS_Y$ in the bottom pixel select sub-controller block 108 of bottom stitching block will be high (not shown), then $VRS_{Y+1}$ in that same block 108, thereafter $VRS_Y$ in the top pixel select sub-controller block 108 of bottom stitching block, then $VRS_{Y+1}$ in that same block 108, thereafter $VRS_Y$ in the bottom pixel select sub-controller block 108 of top stitching block (not shown), then $VRS_{Y+1}$ in that same block 108, thereafter $VRS_Y$ in the top pixel select sub-controller block 108 of top stitching block, then $VRS_{Y+1}$ in that same block 108.

In the image read-out mode, the signals on both dose select lines 114, 115 will be low. Consequently, when for a given row either $VRS_Y$ or $VRS_{Y+1}$ is high and if the global select signal on line 117 is high at the same time, each pixel on that row will be selected for read-out. More in particular, first pixels 106 will be selected via the operation of AND gate 130, whereas second pixels 107 will also be selected as OR gate 132 will provide a high level to AND gate 131 irrespective whether the signal on dose select lines 114 or 115 is high.

Similar to the dose sensing mode, a pixel voltage will be determined in the image read-out mode as was explained in conjunction with FIG. 2. More in particular, each reading cycle of a row of pixels will start with a reset after which charges may be collected by the storage capacitor during the integration time. After this time has elapsed, the row of pixels will be read out and a respective photo-voltage will be stored as a first voltage for each column. Next, the pixels of that row will be reset and the photo-voltage of each pixel will be directly read out and stored as the second voltage. The pixel voltage for a given pixel may then be determined by subtracting the first voltage from the second pixel.

In the image readout mode, each row of pixels can be individually selected to be read out. Accordingly, the present invention allows the image sensor to operate in a dose sensing mode, wherein some pixels are selected and read out simultaneously for each stitching block, and in a image readout mode, wherein every pixel in a given row of a given stitching block is selected and read out simultaneously, despite the fact that the image sensor is comprised of a plurality of identical stitching blocks that are arranged in the column direction.

Figure 5:
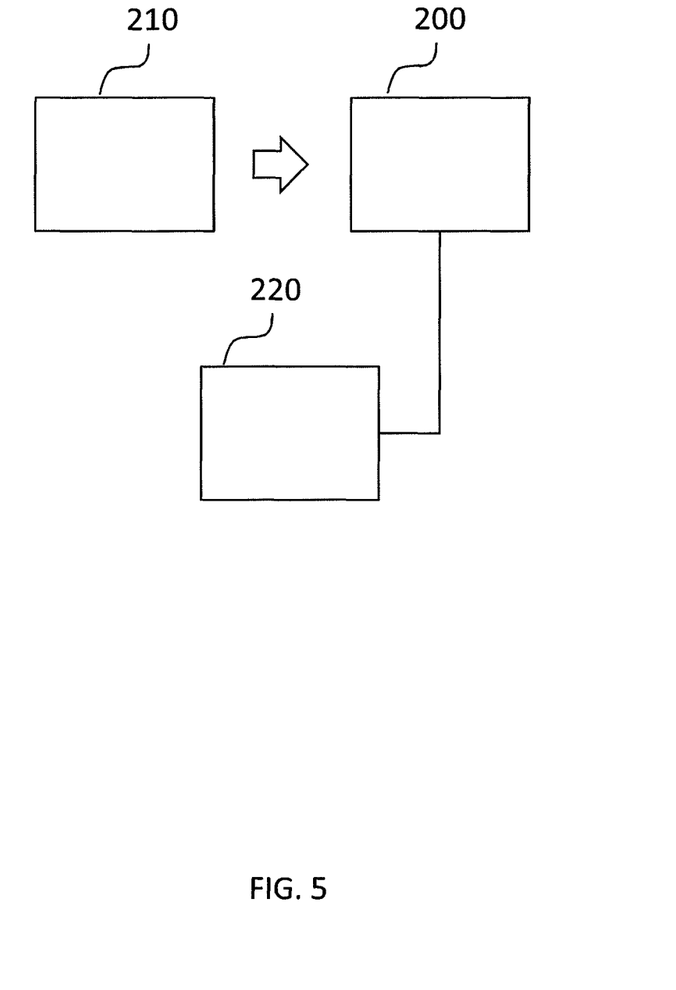
FIG. 5 illustrates an X-ray imaging system in accordance with the present invention.

FIG. 5 illustrates an X-ray imaging system comprising an X-ray source 210, an X-ray detector 200 comprising an image sensor according to the invention, and an image processing unit 220 for constructing an X-ray image based on read-outs of X-ray detector 200.

The X-ray source 210 need not be synchronized with X-ray detector 200. The image sensor comprised in detector 200 may be set to operate in the dose sensing mode, in response to a user input or automatically. In this mode, the second pixels will be read out. Any suitable mathematical operation can be used to determine whether the image read-out mode should be triggered. For example, the average dose among the second pixels may be determined and compared to a predefined threshold. Here, the dose received by a given pixel may be determined using the pixel voltage.

Once it has been determined that the image read-out mode should be triggered, X-ray detector 200 will collect image information in a manner known in the art. This image information, comprising pixel voltages for each pixel in the pixel matrix, is provided to image processing unit 220 that constructs an image based on this information.

The present invention equally relates to an optical system in which the X-ray detector 200 is replaced by an optical detector in which the image sensor of the present invention has been implemented. In this case, the scintillator layer will be omitted. Moreover, the X-ray source 210 may be replaced by a light source, such as a source for emitting flashes light.

As described above, the present invention allows the use of large, multi-stitching block image sensors to be used in non-synchronized X-ray systems without exposing the patient to too much X-ray radiation that is not used for the image formation. In other words, the X-ray dose to which the patient will be subjected to will be used as efficiently as possible.

Although the invention has been described using detailed embodiments thereof, the skilled person will readily understand that the present invention is not limited to these embodiments. Various modifications to these embodiments can be made without departing from the scope of the invention, which is defined by the appended claims.

The invention claimed is:

1. An image sensor, comprising:
   a matrix of rows and columns of photosensitive pixels, wherein the matrix comprises stitching blocks that are adjacently arranged in the column direction of the matrix;
   wherein each stitching block comprises:
      a plurality of first pixels and a plurality of second pixels;
      a plurality of dose select lines configured for carrying respective dose select signals; and
      a pixel select controller configured to:
         in an image read-out mode of the image sensor, simultaneously selecting first pixels and second pixels, in a given row and given stitching block, one row at a time; and
         in a dose sensing mode of the image sensor, simultaneously selecting second pixels in different rows and different stitching blocks in dependence of the dose select signals;
      the image sensor further comprising, at each connecting interface between stitching blocks that are adjacently arranged in the column direction, a dose select line connecting unit for connecting each dose select line of a first stitching block among the adjacent stitching blocks to a respective dose select line of a second stitching block among the adjacent stitching blocks to prevent multiple second pixels in the same column of the matrix from being selected;
      wherein the image sensor is configured to switch or to be switched from the dose sensing mode to the image read-out mode when the dose determined in the dose sensing mode exceeds a predefined threshold.

2. The image sensor of claim 1, wherein each stitching block is identical, wherein each stitching block has been formed using wafer stepper lithography on the basis of the same reticle block.

3. The image sensor of claim 1, wherein the columns of each stitching block comprise at most one second pixel.

4. The image sensor of claim 1, wherein each stitching block comprises:
   a first part arranged on a first side of the stitching block, and a second part arranged on a second side of the stitching block opposite to the first side, wherein the dose select line connecting unit at an interface between a pair of adjacently arranged stitching blocks comprises the first part of one stitching block among the adjacently arranged stitching blocks and the second part of the other stitching block among the adjacently arranged stitching blocks; or
   a respective dose select line connecting unit arranged on a first side of the stitching block.

5. The image sensor of claim 1, wherein the dose select lines are adjacently arranged in the row direction of the matrix in a given order, each dose select line having a given position within said order, wherein the position of a dose select line in a given stitching block is different from the position of the dose select line in the adjacently arranged stitching block to which it is connected.

6. The image sensor of claim 1, wherein the pixel select controller comprises a plurality of identical pixel select sub-controller blocks that are adjacently arranged in the column direction and wherein each pixel select sub-controller block is configured, in the dose sensing mode, to select one among n second pixels that are arranged on respective and preferably adjacent rows, wherein n corresponds to the number of stitching blocks that are adjacently arranged in the column direction.

7. The image sensor of claim 1, wherein the number of stitching blocks adjacently arranged in the column direction is equal to the number of dose select lines.

8. The image sensor of claim 1, further comprising read-out circuitry for reading out photo-voltages of the photosensitive pixels, said read-out circuitry being connected to a plurality of column lines that each are arranged over each stitching block, each column line being connected to a plurality of pixels that are arranged in the same column but in different rows.

9. The image sensor of claim 8, wherein each of the first and second pixels comprises:
   a photodiode for generating a photocurrent;
   a storage capacitor of which a terminal is connected to the photodiode, the voltage at the terminal being referred to as said photo-voltage;
   a reset transistor for resetting the voltage at the terminal to a predefined voltage;
   a select transistor for selecting the pixel in dependence of a pixel select signal; and
   a source follower for feeding the photo-voltage to the column line to which it is connected when the pixel is selected.

10. The image sensor of claim 1, wherein the image sensor is an X-ray sensor in which the matrix of pixels comprises a scintillator layer for converting an incoming X-ray photon into a visible light photon.

11. An X-ray imaging system, comprising:
    an X-ray source;
    an X-ray detector comprising the image sensor as defined in claim 1; and
    an image processing unit for constructing an X-ray image based on read-outs of the X-ray detector.

12. The image sensor of claim 1, wherein the dose select line connecting unit switches an order of at least two dose select lines of the plurality of dose select lines.

13. An image sensor, comprising:
    a matrix of rows and columns of photosensitive pixels, wherein the matrix comprises stitching blocks that are adjacently arranged in the column direction of the matrix;
    wherein each stitching block comprises:
       a plurality of first pixels and a plurality of second pixels;
       a plurality of dose select lines configured for carrying respective dose select signals; and
       a pixel select controller configured to:
          in an image read-out mode of the image sensor, simultaneously selecting first pixels and second pixels, in a given row and given stitching block, one row at a time; and in a dose sensing mode of the image sensor, simultaneously selecting second pixels in different rows and different stitching blocks in dependence of the dose select signals;

the image sensor further comprising, at each connecting interface between stitching blocks that are adjacently arranged in the column direction, a dose select line connecting unit for connecting each dose select line of a first stitching block among the adjacent stitching blocks to a respective dose select line of a second stitching block among the adjacent stitching blocks to prevent multiple second pixels in the same column of the matrix from being selected, wherein the pixel select controller is configured for selecting the first pixels and the second pixels in the image read-out mode in dependence of a global select signal and a row-specific row select signal; and wherein the pixel select controller is configured for selecting the second pixels in the dose sensing mode in dependence of the global select signal and the dose select signals;

the image sensor further comprising:
  a row driver configured to generate the row-specific row select signal for selecting pixels that are in the same row; and
  a timing generator configured to generate the global select signal, and at least one of the dose select signals.

14. An image sensor, comprising:
a matrix of rows and columns of photosensitive pixels, wherein the matrix comprises stitching blocks that are adjacently arranged in the column direction of the matrix;
wherein each stitching block comprises:
  a plurality of first pixels and a plurality of second pixels;
  a plurality of dose select lines configured for carrying respective dose select signals; and
  a pixel select controller configured to:
    in an image read-out mode of the image sensor, simultaneously selecting first pixels and second pixels, in a given row and given stitching block, one row at a time; and
    in a dose sensing mode of the image sensor, simultaneously selecting second pixels in different rows and different stitching blocks in dependence of the dose select signals;
the image sensor further comprising, at each connecting interface between stitching blocks that are adjacently arranged in the column direction, a dose select line connecting unit for connecting each dose select line of a first stitching block among the adjacent stitching blocks to a respective dose select line of a second stitching block among the adjacent stitching blocks to prevent multiple second pixels in the same column of the matrix from being selected,
wherein a level of one or more of the dose select signals is controllable between a low and a high level, and wherein the other dose select signals have a fixed level, wherein the dose select line(s) in each stitching block, of which dose select lines the level can be controlled, are preferably configured to provide a dose select signal for selecting a pattern of second pixels in that stitching block during the dose sensing mode, wherein the patterns of second pixels for different stitching blocks are different, and wherein the patterns of second pixels of different stitching blocks are preferably shifted in the row direction with respect to each other.

15. An image sensor, comprising:
a matrix of rows and columns of photosensitive pixels, wherein the matrix comprises stitching blocks that are adjacently arranged in the column direction of the matrix;
wherein each stitching block comprises:
  a plurality of first pixels and a plurality of second pixels;
  a plurality of dose select lines configured for carrying respective dose select signals; and
  a pixel select controller configured to:
    in an image read-out mode of the image sensor, simultaneously selecting first pixels and second pixels, in a given row and given stitching block, one row at a time; and
    in a dose sensing mode of the image sensor, simultaneously selecting second pixels in different rows and different stitching blocks in dependence of the dose select signals;
the image sensor further comprising, at each connecting interface between stitching blocks that are adjacently arranged in the column direction, a dose select line connecting unit for connecting each dose select line of a first stitching block among the adjacent stitching blocks to a respective dose select line of a second stitching block among the adjacent stitching blocks to prevent multiple second pixels in the same column of the matrix from being selected, further comprising read-out circuitry for reading out photo-voltages of the photosensitive pixels, said read-out circuitry being connected to a plurality of column lines that each are arranged over each stitching block, each column line being connected to a plurality of pixels that are arranged in the same column but in different rows, wherein:
the image sensor is configured to perform a correlated sampling scheme, wherein reading out a photo-voltage of a pixel in the image read-out mode comprises:
  a first read-out step in which the photo-voltage of the pixel is reset to a predefined value and is thereafter being allowed, during an integration time, to change in response to a dose of incident photons, the photo voltage being read as a first voltage after expiry of the integration time; and
  a second read-out step in which the photo-voltage of the pixel is reset to the predefined value and is directly subsequently read as a second voltage;
wherein the read-out circuitry is configured to compute a pixel voltage by subtracting the first voltage from the second voltage; and
wherein the image sensor is configured to perform a correlated sampling scheme, wherein reading out a photo-voltage of a second pixel in the dose sensing mode comprises:
  a step of re-setting the photo-voltage of the pixel to a predefined value; and
  a read-out step of reading the photo-voltage as a third voltage;
  wherein the read-out circuitry is configured to compute a pixel voltage by subtracting the third voltage from the predefined voltage.

* * * * *